United States Patent
Kim et al.

(10) Patent No.: US 7,314,792 B2
(45) Date of Patent: Jan. 1, 2008

(54) METHOD FOR FABRICATING TRANSISTOR OF SEMICONDUCTOR DEVICE

(75) Inventors: Myung-Ok Kim, Ichon-shi (KR); Tae-Woo Jung, Ichon-shi (KR); Sung-Kwon Lee, Ichon-shi (KR); Sea-Ug Jang, Ichon-shi (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 212 days.

(21) Appl. No.: 11/321,591

(22) Filed: Dec. 30, 2005

(65) Prior Publication Data

US 2006/0246730 A1    Nov. 2, 2006

(51) Int. Cl.
H01L 21/8238    (2006.01)
H01L 21/336    (2006.01)
H01L 21/331    (2006.01)
H01L 21/76    (2006.01)

(52) U.S. Cl. .............. 438/225; 438/259; 438/270; 438/274; 438/297; 438/298; 438/362; 438/370; 438/423; 438/700; 438/425; 257/E21.429; 257/E21.166; 257/E21.548; 257/E21.555; 257/E21.553

(58) Field of Classification Search ........ 438/225, 438/259, 270, 274, 297, 298, 362, 370, 423, 438/425, 439, 450, 700
See application file for complete search history.

(56) References Cited

U.S. PATENT DOCUMENTS 6,376,383 B2    4/2002    Mitsuiki

2004/0124492 A1    7/2004    Matsuo
2004/0248348 A1    12/2004    Rausch et al.
2005/0001252 A1*    1/2005    Kim et al. ........... 257/296

FOREIGN PATENT DOCUMENTS

| CN | 1224234 | 6/2003 |
| DE | 103 61 695 B3 | 2/2005 |
| JP | 05-251471 | 9/1993 |
| KR | 10-1998-52470 | 1/2003 |
| KR | 10-2004-0104290 A | 12/2004 |
| TW | 556323 B | 10/2003 |

OTHER PUBLICATIONS

Notice of Search Report from the Taiwanese Patent Office, dated Jan. 28, 2007, in counterpart Taiwanese Patent Application No. 94143167.

(Continued)

Primary Examiner—Michael Lebentritt
Assistant Examiner—Mohsen Ahmadi
(74) Attorney, Agent, or Firm—Finnegan, Henderson, Farabow, Garrett & Dunner L.L.P.

(57) ABSTRACT

A method for fabricating a transistor of a semiconductor device is provided. The method includes: forming device isolation layers in a substrate including a bottom structure, thereby defining an active region; etching the active region to a predetermined depth to form a plurality of recess structures each of which has a flat bottom portion with a critical dimension (CD) larger than that of a top portion; and sequentially forming a gate oxide layer and a metal layer on the recess structures; and patterning the gate oxide layer and the metal layer to form a plurality of gate structures.

23 Claims, 5 Drawing Sheets

OTHER PUBLICATIONS

Notice of Preliminary Rejection from the Korean Intellectual Property Office, dated Nov. 20, 2006, in counterpart Korean Patent Application No. 2005-36184.

First Office Action from the State Intellectual Property Office of the People's Republic of China dated Aug. 17, 2007 in counterpart Chinese patent application No. 200510135164.6.

* cited by examiner

METHOD FOR FABRICATING TRANSISTOR OF SEMICONDUCTOR DEVICE

The present application claims the priority benefits of Korean patent application No. KR 2005-0036184, filed in the Korean Patent Office on Apr. 29, 2005, the entire contents of which are incorporated herein by reference.

TECHNICAL FIELD

The present invention relates to a method for fabricating a semiconductor device; and, more particularly, to a method for fabricating a transistor of a semiconductor device.

DESCRIPTION OF RELATED ARTS

As semiconductor devices have become more highly integrated, electric fields of devices have increased due to high doping concentration and junction leakage current has also increased, resulting in device defects such as degradation of a refresh characteristic.

As one method of overcoming the above limitation, active regions beneath gate structures have been recessed to form gate structures within the active regions with increased channel lengths, which may attenuate electric fields of devices. Recess channel array transistors (RCAT) has been introduced specifically to improve the refresh characteristic.

A gate structure of the RCAT should accurately overlap with a recessed portion of the RCAT. If the gate structure is misaligned with the recessed portion or the final inspection critical dimension (FICD) of the recessed portion is larger than the CD of the gate structure, the active region may be damaged during an etching of the gate structure. The increase in the CD of the recessed portion causes damage to the device isolation region in wider areas during the etching for the recessed portion and thus, a seam generated between a gate polysilicon layer and a tungsten silicide layer becomes very large. As a result, there is a high risk of self-aligned contact (SAC) failure, which is highly correlated to device characteristics and yield. Therefore, in view of damage on the active region caused by the misalignment and the SAC failure caused by the increase in the CD of the recessed portion, it is advantageous to have the recessed portion with a smaller CD. On the other hand, in view of a channel length, it is advantageous to have the recessed portion with a larger CD. Hence, conventional U-shaped recess gate structures have a limitation as the design rule has been shifted towards micronization.

Also, as the CD of the gate structure gets smaller, the CD of the recessed portion should be smaller. Thus, it may be difficult to form a flat bottom structure of the conventional U-shaped recessed gate structure. If the bottom structure is less flat, a depletion area of storage node junction increases. The increasing depletion area may result in increase of junction leakage current and degradation of a refresh characteristic.

SUMMARY

Consistent with the present invention, there is provided a method for fabricating a transistor of a semiconductor device with an improved refresh characteristic.

Consistent with the present invention, there is provided a method for fabricating a transistor of a semiconductor device, including: forming device isolation layers in a substrate including a bottom structure, thereby defining an active region; etching the active region to a predetermined depth to form a plurality of recess structures each of which has a flat bottom portion with a critical dimension (CD) larger than that of a top portion; and sequentially forming a gate oxide layer and a metal layer on the recess structures; and patterning the gate oxide layer and the metal layer to form a plurality of gate structures.

BRIEF DESCRIPTION OF THE DRAWINGS

The present invention will become better understood with respect to the following description of the preferred embodiments given in conjunction with the accompanying drawings, in which.

DETAILED DESCRIPTION

A method for fabricating a transistor of a semiconductor device in accordance with exemplary embodiments consistent with the present invention will be described in detail with reference to the accompanying drawings.

Figure 1:
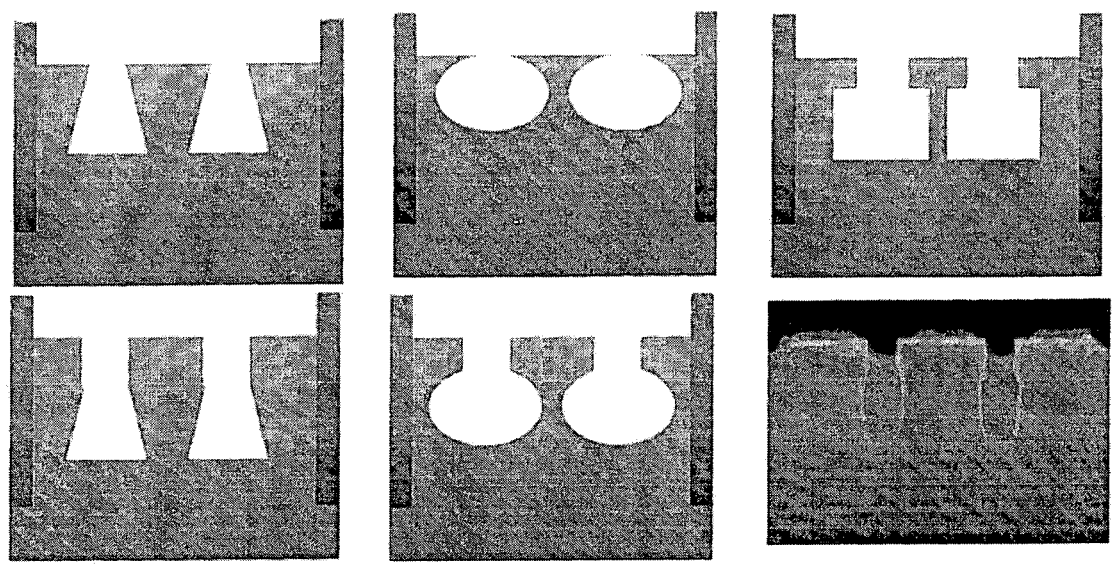
FIG. 1 shows micrographic images of various exemplary flat bottom portions of recess structures consistent with the present invention.

A bottom portion of a recess structure has a critical dimension (CD) larger than that of a top portion of the recess structure, and the bottom portion is formed flatly. Various exemplary recess structures are illustrated in FIG. 1.

FIGS. 2A to 2F are cross-sectional views of transistors of a semiconductor device fabricated in accordance with embodiments of the present invention for illustrating a method for fabricating the same.

Figure 2A:
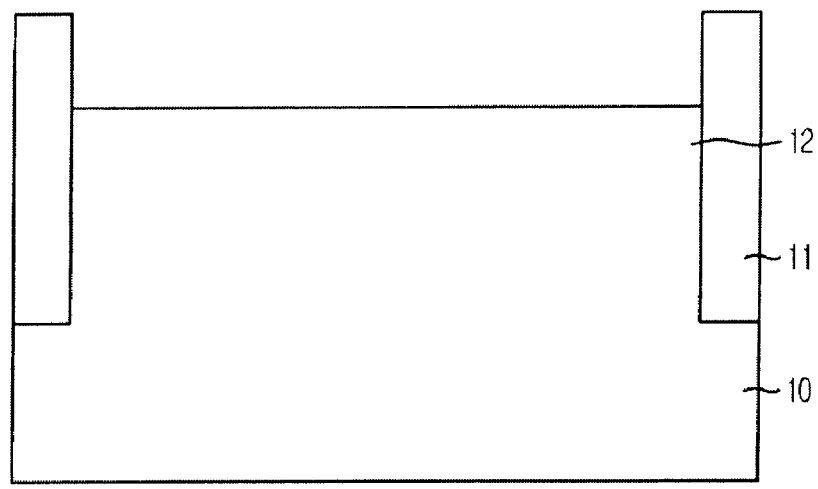
FIGS. 2A to 2F are cross-sectional views showing transistors of a semiconductor device consistent with embodiments of the present invention for illustrating a method for fabricating the same.

Referring to FIG. 2A, device isolation layers 11 are formed by performing a shallow trench isolation (STI) process on a substrate 10 including a predetermined bottom structure. The device isolation layers 11, which are field oxide layers, define an active region 12. The substrate 10 may comprise silicon.

Figure 2B:
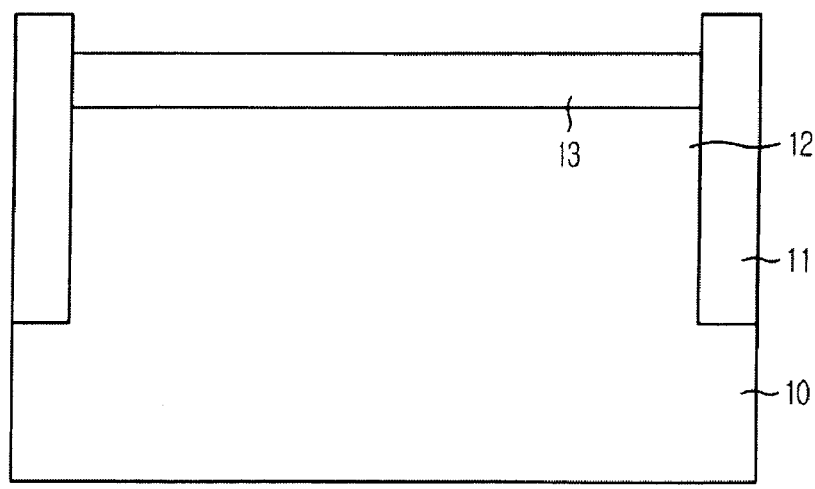

Referring to FIG. 2B, a screening oxide layer 13 is formed on a predetermined portion of the substrate 10, i.e., on the active region 12. The screening oxide layer 13 plays a role in screening an ion implantation process. Afterwards, the ion implantation process is performed to a depth at which bottom portions of recess structures are to be formed. Although it is advantageous to perform the ion implantation process prior to forming the recess structures, the ion implantation process can also be performed after the recess structures are formed. In the latter case, a pad oxide layer is formed instead of the screening oxide layer 13. Herein, the screening oxide layer 13 is exemplified in an embodiment consistent with the present invention.

Figure 2C:
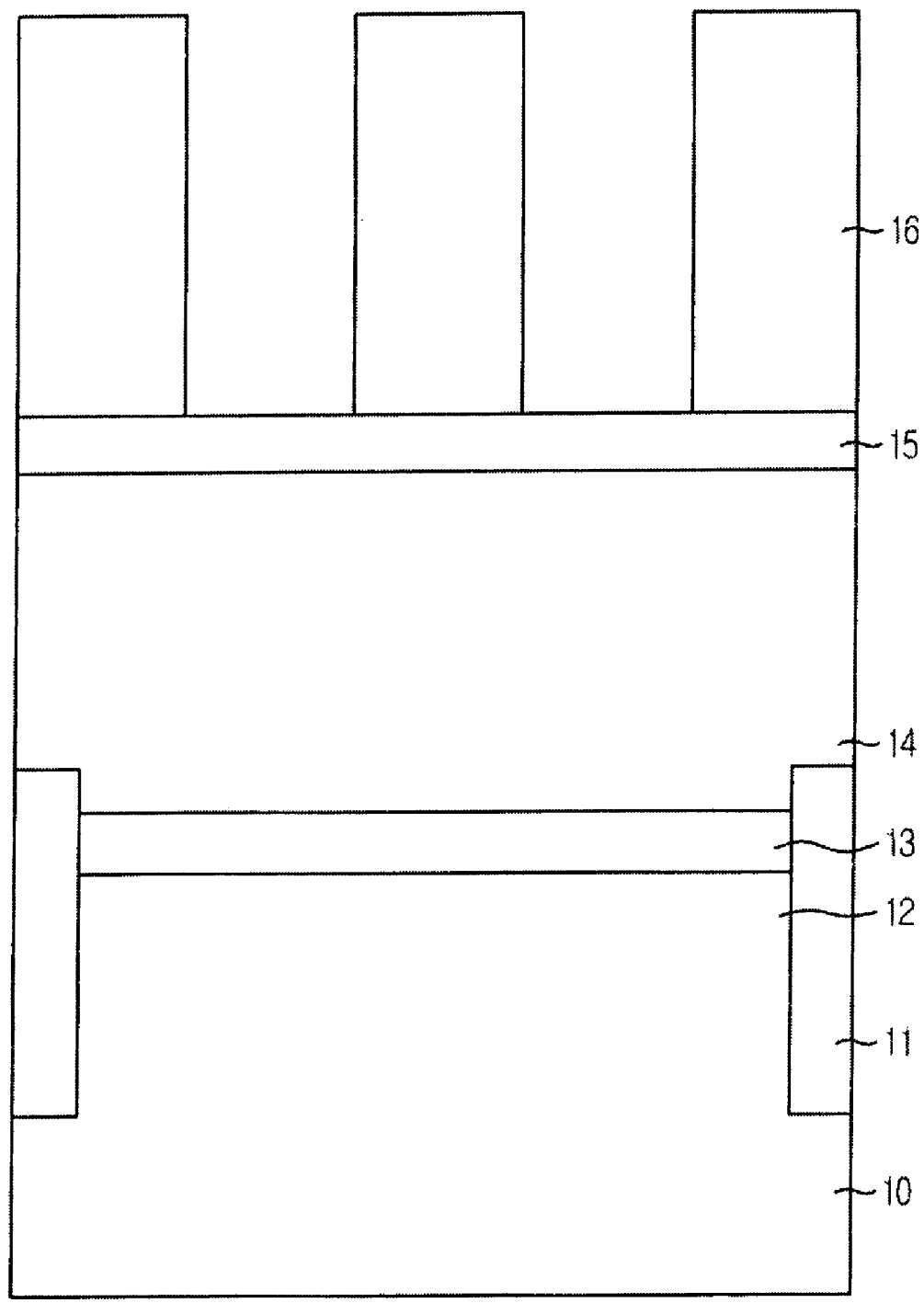

Referring to FIG. 2C, a hard mask layer 14 and a bottom anti-reflective coating (BARC) layer 15 are sequentially formed on the ion-implanted resulting structure. A photoresist pattern 16 is formed on the BARC layer 15. The hard mask layer 14 includes polysilicon, nitride, or silicon oxynitride. The BARC layer 15 may include an organic-based material.

Figure 2D:
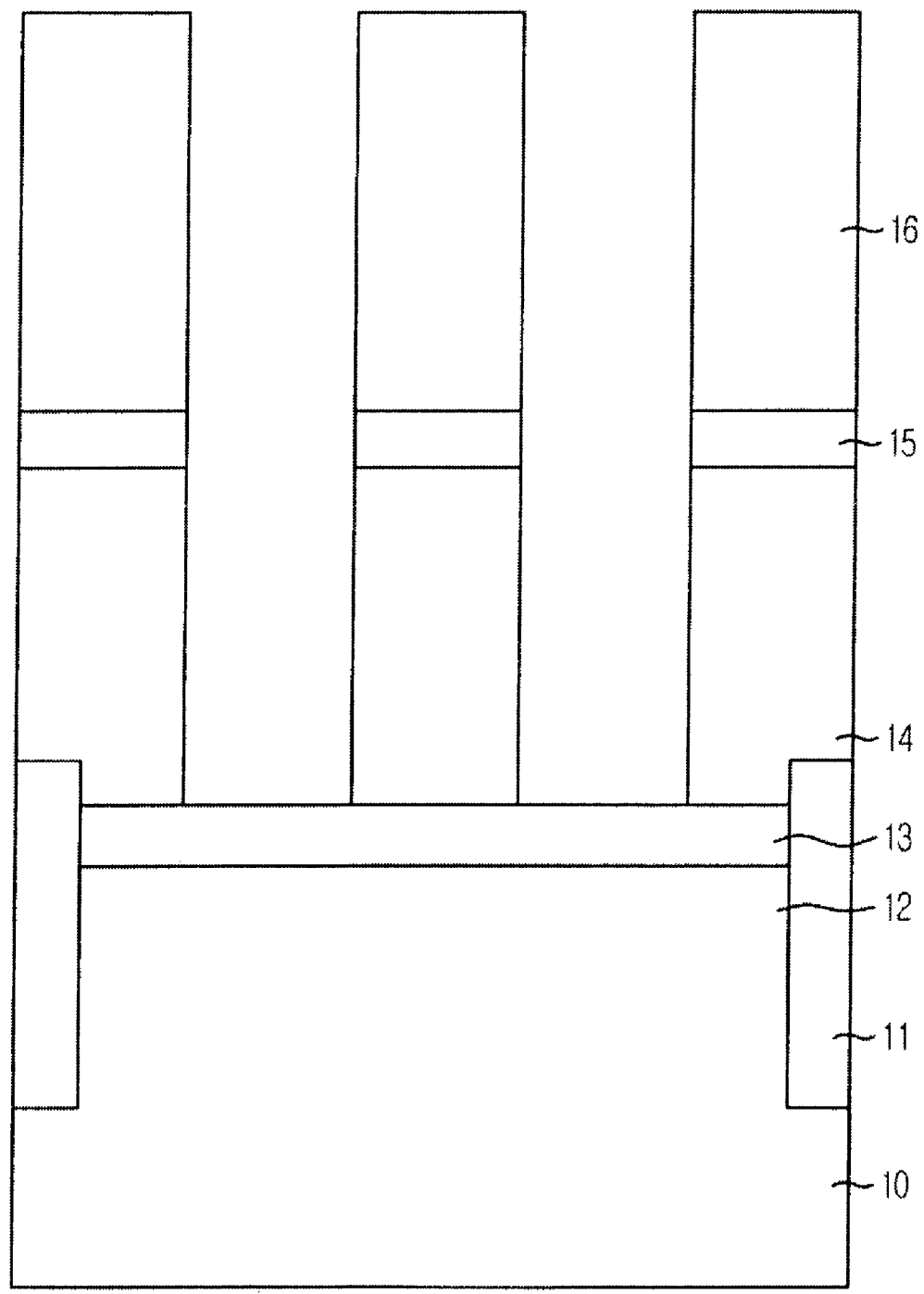

Referring to FIG. 2D, the BARC layer 15 and the hard mask layer 14 are patterned using the photoresist pattern 16 as an etch mask. The BARC layer 15 is etched using a gas mixture of $CF_4/CHF_3/O_2/SF_6/NF_3$, and the hard mask layer 14 is etched in an angle of approximately 80 degrees to approximately 90 degrees. Particularly, a thickness of the hard mask layer 14 is set to be less than that of the individual recess structure, so that the hard mask layer 14 can be removed after the recess structures are formed. The screening oxide layer 13 remains in a thickness ranging from approximately 50 Å to approximately 200 Å, or a portion of the active region 12 is removed in a thickness of approximately 50 Å to approximately 200 Å.

Figure 2E:
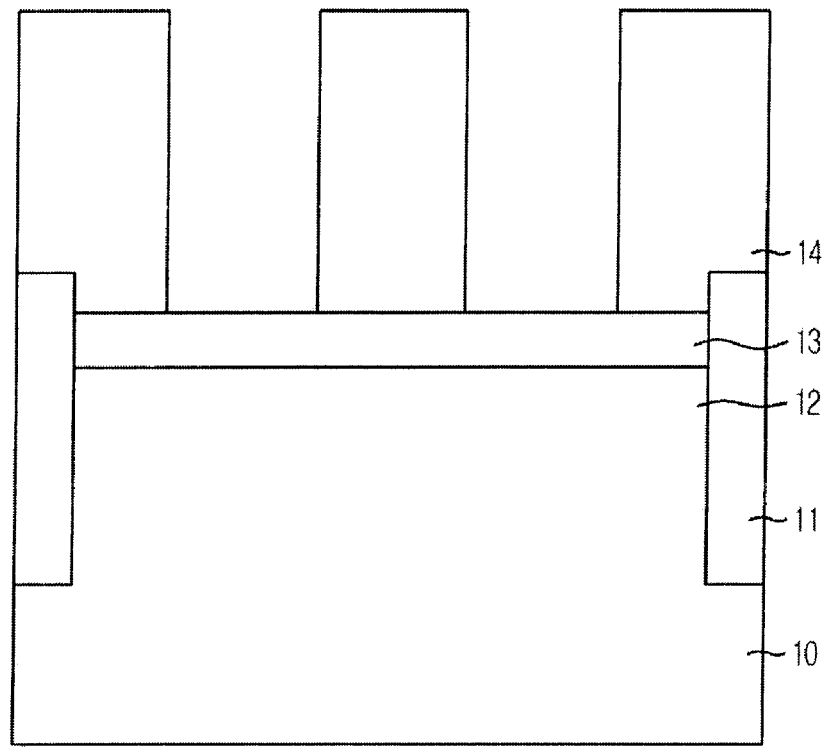

Referring to FIG. 2E, the photoresist pattern 16 and the BARC layer 15 are removed.

Figure 2F:
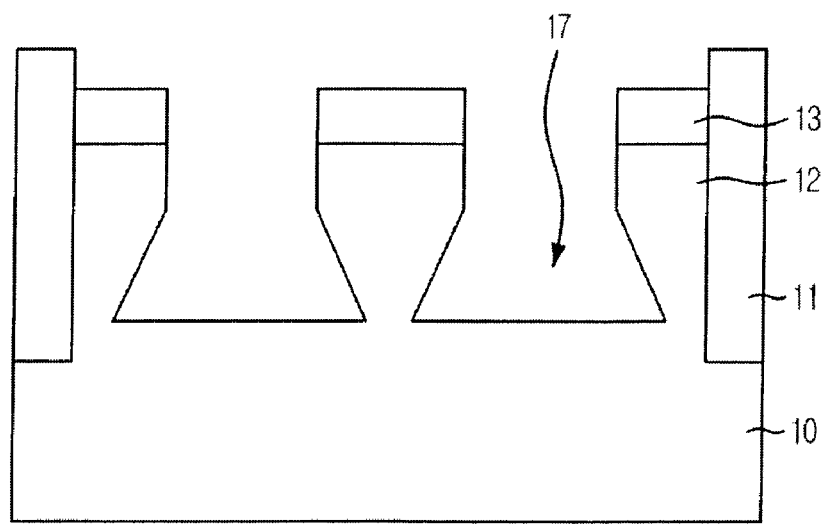

Referring to FIG. 2F, the screening oxide layer 13 and the active region 12 are etched to a predetermined depth using the above patterned hard mask layer 14 as an etch mask, thereby forming recess structures recess structures 17. As FIG. 2F shows, a bottom portion of recess structures 17 has a CD larger than that of a top portion of recess structures 17. Also, the bottom portion of each of the recess structures 17 is flat. At the same moment of forming the recess structures 17, the hard mask layer 14 is removed.

Etching recipes and sequential steps of forming the recess structures 17 as illustrated above are as follows. First, a gas of $CF_4$ or a gas of $CHF_3$ is used alone or in combination to etch the screening oxide layer 13. A gas mixture of $Cl_2/HBr/O_2/SF_6/N_2$ is used to etch the active region 12 of the substrate 10 to a predetermined depth. An isotropic etching process is then performed to form the recess structures 17.

The isotropic etching process is performed at a pressure of approximately 10 mTorr to approximately 100 mTorr along with a high top portion power of approximately 400 W to approximately 1,500 W and a low bottom portion power of approximately 0 W to approximately 5 W. The aforementioned etching processes are performed in-situ at an inductively coupled plasma (ICP) etcher. A ratio of the $Cl_2$ gas to the HBr gas is approximately 1 to approximately 0.5 to approximately 3 (1:0.5~1:3). The recessing depth is controlled to be in a range from approximately 500 Å to approximately 2,000 Å. The isotropic etching process etches the target at a rate of less than approximately 10 Å per second using a gas mixture of $CF_4/O_2/He/Ar$.

The isotropic etching process etches polymers, which are generated during formation of the recesses 17, at the bottom portion of each recess structure 17 more rapidly than at the top portion, thereby enlarging the CDs of the bottom portions. Also, the isotropic etching process can remove silicon remnants called horns formed on sidewalls of the recess structures 17.

After the formation of the recess structures 17, an isotropic chemical dry etching (CDE) process is performed to remove a damaged surface layer of the above resulting structure and make top and bottom edges of the recess structures 17 round. The isotropic CDE process is performed in a down-stream mode using a microwave type or ICP type plasma. Also, the isotropic CDE process uses a gas mixture of $CF_4/O_2$ gas or another gas mixture of $NF_3/O_2/He$ alone or in combination and has an etch rate of less than approximately 150 Å per minute.

The screening oxide layer 13 is removed by a wet cleaning process. Although not illustrated, a gate oxide layer is formed in recess structures 17, and top edges are rounded by a conformal oxidation process. A metal layer is formed on the gate oxide layer and patterned to obtain gate structures.

According to embodiments of the present invention, as the design rule has been shifted down to a size of approximately 50 nm, the suggested fabrication method may still be implemented. A frequency of damage generally occurring when gate structures and recess structures are misaligned can be reduced and the effective channel length can be secured easily. As a result of these effects, it is possible to improve a refresh characteristic and reduce an incidence of SAC failure, further resulting in device yields.

While the present invention has been described with respect to certain preferred embodiments, it will be apparent to those skilled in the art that various changes and modifications may be made without departing from the spirit and scope of the invention as defined in the following claims.

What is claimed is:

1. A method for fabricating a transistor of a semiconductor device, comprising:
    forming device isolation layers in a substrate including a bottom structure, thereby defining an active region;
    etching the active region to a predetermined depth to form a plurality of recess structures each of which has a flat bottom portion with a critical dimension (CD) larger than that of a top portion thereof; and
    sequentially forming a gate oxide layer and a metal layer on the recess structures; and
    patterning the gate oxide layer and the metal layer to form a plurality of gate structures.

2. The method of claim 1, wherein forming the plurality of the recess structures comprises:
    etching the active region to the predetermined depth using a gas mixture of $Cl_2/HBr/O_2/SF_6/N_2$; and
    performing an isotropic etching process.

3. The method of claim 2, wherein etching the active region and the isotropic etching process comprise etching the active region and performing an isotropic etching process in-situ at an inductively coupled plasma etcher.

4. The method of claim 2, wherein etching the active region comprises etching the active region the gas mixture having a ratio of the $Cl_2$ gas to the HBr gas is approximately 1:0.5~1:3.

5. The method of claim 2, wherein the isotropic etching process comprises isotropically etching at a pressure of approximately 10 mTorr to approximately 100 mTorr with a high top portion power of approximately 400 W to approximately 1,500 W and a low bottom portion power of approximately 0 W to approximately 5 W.

6. The method of claim 2, wherein etching the active region comprises etching the active region to a predetermined recessing depth ranging from approximately 500 Å to approximately 2,000 Å.

7. The method of claim 2, wherein performing the isotropic etching process comprises removing polymers generated during formation of the recess structures more rapidly at the bottom portions of the recess structures than at the top portions of the recess structures, thereby enlarging the CD of the bottom portions.

8. The method of claim 2, wherein performing the isotropic etching process comprises performing the isotropic etching process at an etch rate of approximately 10 Å per second using a gas mixture of $CF_4/O_2/He/Ar$.

9. The method of claim 2, wherein performing the isotropic etching process further comprises removing silicon remnants generated on sidewalls of the recess structures.

10. The method of claim 2, further comprising performing an isotropic chemical dry etching process to remove a damaged surface layer of the recess structures and round top and bottom edges of the recess structures after forming the recess structure.

11. The method of claim 10, wherein performing the isotropic chemical dry etching process comprises performing the isotropic chemical dry etching process in a down-stream mode using one of a microwave plasma and an inductively coupled plasma.

12. The method of claim 10, wherein performing the isotropic chemical dry etching process comprises performing the isotropic chemical dry etching process at an etch rate of less than approximately 150 Å per minute and using a gas mixture selected from the group consisting of $CF_4/O_2$, $NF_3/O_2/He$ and a combination thereof.

13. The method of claim 10, further comprising rounding top edges by a conformal oxidation process after performing the isotropic chemical dry etching process.

14. The method of claim 1, further comprising performing the following steps prior to etching the active region:
- forming a screening oxide layer on the active region of the substrate;
- performing an ion implantation process through the screening oxide layer;
- sequentially forming a hard mask layer, a bottom anti-reflective coating layer and a photoresist pattern on the screening oxide layer;
- patterning the bottom anti-reflective coating layer and the hard mask layer using the photoresist pattern as an etch mask;
- removing the photoresist pattern and the bottom anti-reflective coating layer; and
- etching the screening oxide layer using the patterned hard mask layer as an etch mask.

15. The method of claim 14, further comprising patterning the bottom anti-reflective coating layer first and then, patterning the hard mask layer.

16. The method of claim 14, wherein patterning the bottom anti-reflective coating layer comprises patterning the bottom antireflective coating layer using a gas mixture of $CF_4/CHF_3/O_2/SF_6/NF_3$.

17. The method of claim 14, wherein patterning the hard mask layer comprises patterning the hard mask layer by performing a vertical etching at an angle of approximately 80 degrees to approximately 90 degrees.

18. The method of claim 14, wherein patterning the hard mask layer comprises patterning the hard mask layer to have a thickness smaller than the recessing depth, so that the hard mask layer is removed after the recess structures are formed.

19. The method of claim 14, wherein etching the screening oxide layer comprises etching the screening oxide layer to have a thickness ranging from approximately 50 Å to approximately 200 Å and the etching depth of the active region ranges from approximately 50 Å to approximately 200 Å.

20. The method of claim 14, wherein forming the hard mask layer comprises forming the hard mask layer from a material selected from the group consisting of polysilicon, nitride and silicon oxynitride.

21. The method of claim 14, wherein forming the bottom anti-reflective coating layer comprises forming the bottom anti-reflective coating from an organic-based material.

22. The method of claim 14, wherein etching the screening oxide layer comprises etching the screening oxide layer using a gas selected from a group consisting of $CF_4$, $CHF_3$, and a combination thereof.

23. The method of claim 1, further comprising performing an ion implantation process after etching the active region.

* * * * *

UNITED STATES PATENT AND TRADEMARK OFFICE
CERTIFICATE OF CORRECTION

PATENT NO. : 7,314,792 B2
APPLICATION NO. : 11/321591
DATED : January 1, 2008
INVENTOR(S) : Myung Ok Kim et al.

It is certified that error appears in the above-identified patent and that said Letters Patent is hereby corrected as shown below:

Claim 4, Column 4, line 32, "region the" should read --region of the--.

Claim 16, Column 5, line 31, "antireflective" should read --anti-reflective--.

Signed and Sealed this

Twelfth Day of August, 2008

JON W. DUDAS
*Director of the United States Patent and Trademark Office*